(12) United States Patent
Vasilache et al.

(10) Patent No.: US 10,109,287 B2
(45) Date of Patent: Oct. 23, 2018

(54) METHOD AND APPARATUS FOR RESILIENT VECTOR QUANTIZATION

(71) Applicant: Nokia Technologies Oy, Espoo (FI)

(72) Inventors: Adriana Vasilache, Tampere (FI); Lasse Juhani Laaksonen, Tampere (FI); Anssi Sakari Rämö, Tampere (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/439,132

(22) PCT Filed: Oct. 30, 2012

(86) PCT No.: PCT/FI2012/051044
§ 371 (c)(1),
(2) Date: Apr. 28, 2015

(87) PCT Pub. No.: WO2014/068167
PCT Pub. Date: May 8, 2014

(65) Prior Publication Data
US 2015/0287418 A1 Oct. 8, 2015

(51) Int. Cl.
*G10L 19/07* (2013.01)
*G10L 19/038* (2013.01)
(Continued)

(52) U.S. Cl.
CPC .......... *G10L 19/038* (2013.01); *G10L 19/005* (2013.01); *G10L 19/07* (2013.01);
(Continued)

(58) Field of Classification Search
CPC ..... G10L 19/038; G10L 19/07; G10L 19/005; G10L 19/22; G10L 2019/0016; G10L 2019/0001; H03M 7/3082
(Continued)

(56) References Cited

U.S. PATENT DOCUMENTS 5,970,443 A 10/1999 Fujii
6,009,387 A 12/1999 Ramaswamy et al.
(Continued)

FOREIGN PATENT DOCUMENTS

CN 1420487 A 5/2003
CN 1659785 A 8/2005
(Continued)

OTHER PUBLICATIONS

Predictive VQ for bandwidth scalable LSP quantization by Hiroyuki Eharat et al, <atrsushita electric, , 0-7803-8874—7/05/$20 2005 IEEE.*
(Continued)

*Primary Examiner* — Bharatkumar S Shah
(74) *Attorney, Agent, or Firm* — Alston & Bird LLP

(57) ABSTRACT

It is inter alia disclosed to quantize a vector of a plurality of coefficients using a predictive mode of operation of a vector quantizer, wherein the vector quantizer can operate in either a predictive mode of operation or a non-predictive mode of operation, determine a vector of a plurality of recovered coefficients; compare the vector of the plurality of coefficients to the vector of the plurality of recovered coefficients; and determine the mode of operation of the vector quantizer for a vector of a plurality of coefficients associated with a subsequent frame of audio samples, wherein the mode of operation is dependent on the comparison.

14 Claims, 6 Drawing Sheets

(51) Int. Cl.
*G10L 19/22* (2013.01)
*H03M 7/30* (2006.01)
*G10L 19/005* (2013.01)
*G10L 19/00* (2013.01)

(52) U.S. Cl.
CPC .......... *G10L 19/22* (2013.01); *H03M 7/3082* (2013.01); *G10L 2019/0001* (2013.01); *G10L 2019/0016* (2013.01)

(58) Field of Classification Search
USPC ........................................................ 704/230
See application file for complete search history.

(56) References Cited

U.S. PATENT DOCUMENTS

| | | | |
|---|---|---|---|
| 2002/0138260 A1* | 9/2002 | Kim | G10L 19/07 704/230 |
| 2005/0285764 A1 | 12/2005 | Besette et al. | |
| 2006/0080090 A1 | 4/2006 | Ramo et al. | |
| 2006/0188025 A1* | 8/2006 | Hannuksela | H04N 19/105 375/240.27 |
| 2008/0180307 A1 | 7/2008 | Ramo et al. | |
| 2008/0249767 A1* | 10/2008 | Ertan | G10L 19/005 704/219 |
| 2008/0253457 A1* | 10/2008 | Moore | H04N 19/52 375/240.16 |
| 2009/0228284 A1 | 9/2009 | Moon et al. | |
| 2012/0177234 A1 | 7/2012 | Rank et al. | |

FOREIGN PATENT DOCUMENTS

| | | |
|---|---|---|
| CN | 101419802 A | 4/2009 |
| CN | 101611550 A | 12/2009 |
| CN | 102714776 A | 10/2012 |
| WO | WO 2008/092719 A1 | 8/2008 |

OTHER PUBLICATIONS

Eharat et al predictive VQ (IEEE year 2005NPL).*
Hiroyuki Eharat et al "Predictive VQ for Nandwidth scalable LSF Quantization" IEEE 2005.*
Predictive VQ for Bandwidth Scalable LSP Quantization Hiroyuki Ehara†, Toshiyuki Morii‡, Masahiro Oshikiri† and Koji Yoshida†.*
Hiroyuki Eharat et al (Predictive VQ for Bandwidth Scalable LSP Quantization by Hiroyuki Ehara, Toshiyuki Mark, Masahira Oshikiri] and Kop Yoshida] Next-Generation Mobile Communications Development Center, AV Core Technology Development Center, Matsushita Electric Industrial Co., Ltd).*
International Search Report and Written Opinion received for corresponding Patent Cooperation Treaty Application No. PCT/FI2012/051044, dated Sep. 16, 2013, 11 pages.
Jelinek M. et al. "Widerband speech coding advances in VMP-WB standard", IEEE Trans. on Audio, Speech and Language Processing, vol. 15 No. 4, May 2007, pp. 1167-1179.
Ehara H. et al. "Predictive VQ for bandwidth scalable LSP quantization", Int. Cont. on Acoustics, Speech, and Signal Processing (ICASSP 2005), Philadelphia USA Mar. 18-23, 2005. pp. 1-137, 1-140.
Extended European Search Report received for corresponding European Patent Application No. 12887405.4, dated Jun. 17, 2016, 9 pages.
Vasilache et al., "Multiple-Scale Leader-Lattice VQ With Applications to LSF Quantization", Signal Processing, vol. 82, No. 4, Apr. 2002, pp. 563-586.
Office Action for Chinese Application No. 201280076737.0 dated Jan. 6, 2017.
Office Action for Chinese Application No. 201280076739.0 dated Sep. 27, 2017, 6 pages total.

* cited by examiner

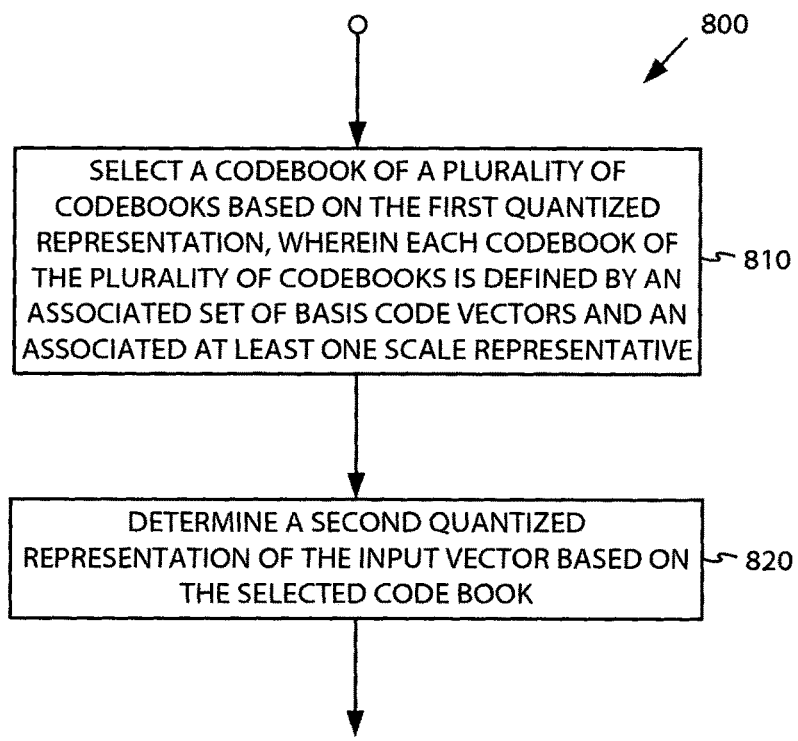
FIG. 8A
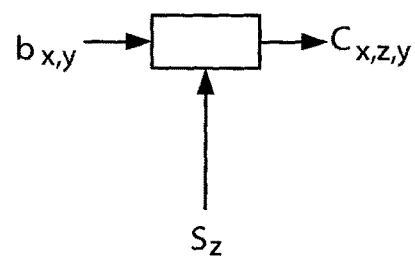
FIG. 8B
FIG. 8C

METHOD AND APPARATUS FOR RESILIENT VECTOR QUANTIZATION

RELATED APPLICATION

This application was originally filed as PCT Application No. PCT/FI2012/051044 filed Oct. 30, 2012.

FIELD OF THE APPLICATION

The present application relates to coding, and in particular, but not exclusively to speech or audio coding.

BACKGROUND OF THE APPLICATION

Audio signals, like speech or music, are encoded for example to enable efficient transmission or storage of the audio signals.

Audio encoders and decoders are used to represent audio based signals, such as music and background noise. These types of coders typically do not utilise a speech model for the coding process, rather they use processes for representing all types of audio signals, including speech.

Speech encoders and decoders (codecs) are usually optimised for speech signals, and can operate at either a fixed or variable bit rate.

Coefficients from speech and audio codecs may be quantised using vector quantisation techniques. In particular, some coefficients can be quantised using predictive quantisation whereby past quantised vectors of are used to predict the value of a current vector of coefficients.

However, the use of prediction for quantising vectors can result in annoying artefacts in the decoded speech or audio signal. This can particularly occur during a frame erasure event, especially after a long run of prediction in the vector quantiser.

SUMMARY OF SOME EMBODIMENTS

The following embodiments aim to address the above problem.

There is provided according to an aspect of the application a method comprising: quantising a vector of a plurality of coefficients using a predictive mode of operation of a vector quantiser, wherein the vector quantiser can operate in either a predictive mode of operation or a non-predictive mode of operation, and wherein the plurality of coefficients are associated with a frame of audio samples; determining a vector of a plurality of recovered coefficients which correspond to the vector of the plurality of coefficients when the vector of the plurality of coefficients is subjected to a frame erasure event; comparing the vector of the plurality of coefficients to the vector of the plurality of recovered coefficients; and determining the mode of operation of the vector quantiser for a vector of a plurality of coefficients associated with a subsequent frame of audio samples, wherein the mode of operation is dependent on the comparison.

The comparing the vector of the plurality of coefficients to the vector of the plurality of recovered coefficients may comprise: determining a distortion measure between the vector of the plurality of coefficients and the vector of the plurality of recovered coefficients; and comparing the determined distortion measure to a pre-determined threshold value.

The frame of audio samples may be encoded according to a selected one of a plurality of coding modes, and determining the mode of operation of the vector quantiser dependent on the comparison may comprise determining the mode of operation of the vector quantiser dependent on the comparison and the selected one of the plurality of coding modes.

The vector of the plurality of recovered coefficients can be generated by at least part of a frame error concealment process.

The at least part of the frame error concealment process may be equivalent to at least part of a frame error concealment process at a decoder arranged to de-quantise the vector of the plurality of coefficients.

The distortion measure can be a Euclidean distance between the vector of the plurality of coefficients and the vector of the plurality of recovered coefficients.

Alternatively, the distortion measure can be a L1-norm distance between the vector of the plurality of coefficients and the vector of the plurality of recovered coefficients.

The vector of the plurality of coefficients can preferably be a vector of a plurality of coefficients representative of a plurality of spectral coefficients of the frame of audio samples.

The vector of the plurality of coefficients representative of the plurality of spectral coefficients of the frame of audio samples can be a vector of a plurality of line spectral frequencies.

According to a further aspect of the application there is provided an apparatus configured to: quantise a vector of a plurality of coefficients using a predictive mode of operation of a vector quantiser, wherein the vector quantiser can operate in either a predictive mode of operation or a non-predictive mode of operation, and wherein the plurality of coefficients are associated with a frame of audio samples; determine a vector of a plurality of recovered coefficients which correspond to the vector of the plurality of coefficients when the vector of the plurality of coefficients is subjected to a frame erasure event; compare the vector of the plurality of coefficients to the vector of the plurality of recovered coefficients; and determine the mode of operation of the vector quantiser for a vector of a plurality of coefficients associated with a subsequent frame of audio samples, wherein the mode of operation is dependent on the comparison.

The apparatus configured to compare the vector of the plurality of coefficients to the vector of the plurality of recovered coefficients may be further configured to: determine a distortion measure between the vector of the plurality of coefficients and the vector of the plurality of recovered coefficients; and compare the determined distortion measure to a pre-determined threshold value.

The frame of audio samples can be encoded according to a selected one of a plurality of coding modes, and the apparatus configured to determine the mode of operation of the vector quantiser dependent on the comparison may be configured to determine the mode of operation of the vector quantiser dependent on the comparison and the selected one of the plurality of coding modes.

The apparatus can be configured to generate the vector of the plurality of recovered coefficients by using at least part of a frame error concealment process.

The at least part of the frame error concealment process may be equivalent to at least part of a frame error concealment process at a decoder arranged to de-quantise the vector of the plurality of coefficients.

The distortion measure can be a Euclidean distance between the vector of the plurality of coefficients and the vector of the plurality of recovered coefficients.

Alternatively, the distortion measure can be a L1-norm distance between the vector of the plurality of coefficients and the vector of the plurality of recovered coefficients.

The vector of the plurality of coefficients can be a vector of a plurality of coefficients representative of a plurality of spectral coefficients of the frame of audio samples.

The vector of the plurality of coefficients representative of the plurality of spectral coefficients of the frame of audio samples may be a vector of a plurality of line spectral frequencies.

According to another aspect of the application there is provided an apparatus comprising at least one processor and at least one memory including computer code for one or more programs, the at least one memory and the computer code configured with the at least one processor to cause the apparatus at least to: quantise a vector of a plurality of coefficients using a predictive mode of operation of a vector quantiser, wherein the vector quantiser can operate in either a predictive mode of operation or a non-predictive mode of operation, and wherein the plurality of coefficients are associated with a frame of audio samples; determine a vector of a plurality of recovered coefficients which correspond to the vector of the plurality of coefficients when the vector of the plurality of coefficients is subjected to a frame erasure event; compare the vector of the plurality of coefficients to the vector of the plurality of recovered coefficients; and determine the mode of operation of the vector quantiser for a vector of a plurality of coefficients associated with a subsequent frame of audio samples, wherein the mode of operation is dependent on the comparison.

The at least one memory and the computer code configured with the at least one processor configured to cause the apparatus at least to compare the vector of the plurality of coefficients to the vector of the plurality of recovered coefficients may be further configured to cause the apparatus at least to: determine a distortion measure between the vector of the plurality of coefficients and the vector of the plurality of recovered coefficients; and compare the determined distortion measure to a pre-determined threshold value.

The frame of audio samples can be encoded according to a selected one of a plurality of coding modes, and wherein the at least one memory and the computer code configured with the at least one processor configured to cause the apparatus at least to determine the mode of operation of the vector quantiser dependent on the comparison may be configured to cause the apparatus at least to determine the mode of operation of the vector quantiser dependent on the comparison and the selected one of the plurality of coding modes.

The at least one memory and the computer code may be configured with the at least one processor to cause the apparatus at least to generate the vector of the plurality of recovered coefficients by using at least part of a frame error concealment process.

The at least part of the frame error concealment process may be equivalent to at least part of a frame error concealment process at a decoder arranged to de-quantise the vector of the plurality of coefficients.

The distortion measure can be a Euclidean distance between the vector of the plurality of coefficients and the vector of the plurality of recovered coefficients.

Alternatively, the distortion measure can be a L1-norm distance between the vector of the plurality of coefficients and the vector of the plurality of recovered coefficients.

The vector of the plurality of coefficients may preferably be a vector of a plurality of coefficients representative of a plurality of spectral coefficients of the frame of audio samples.

The vector of the plurality of coefficients representative of the plurality of spectral coefficients of the frame of audio samples can be a vector of a plurality of line spectral frequencies.

According to yet another aspect of the application there is provided a computer program code when executed by a processor realizes: quantising a vector of a plurality of coefficients using a predictive mode of operation of a vector quantiser, wherein the vector quantiser can operate in either a predictive mode of operation or a non-predictive mode of operation, and wherein the plurality of coefficients are associated with a frame of audio samples; determining a vector of a plurality of recovered coefficients which correspond to the vector of the plurality of coefficients when the vector of the plurality of coefficients is subjected to a frame erasure event; comparing the vector of the plurality of coefficients to the vector of the plurality of recovered coefficients; and determining the mode of operation of the vector quantiser for a vector of a plurality of coefficients associated with a subsequent frame of audio samples, wherein the mode of operation is dependent on the comparison.

The computer program code when executed by the processor realizes comparing the vector of the plurality of coefficients to the vector of the plurality of recovered coefficients the computer program code may further realize: determining a distortion measure between the vector of the plurality of coefficients and the vector of the plurality of recovered coefficients; and comparing the determined distortion measure to a pre-determined threshold value.

The frame of audio samples can be encoded according to a selected one of a plurality of coding modes, and wherein the computer program code when executed by the processor realizes determining the mode of operation of the vector quantiser dependent on the comparison the computer program code may further realize: determining the mode of operation of the vector quantiser dependent on the comparison and the selected one of the plurality of coding modes.

The computer program code may further realize generating the vector of the plurality of recovered coefficients by using at least part of a frame error concealment process.

The at least part of the frame error concealment process may preferably be equivalent to at least part of a frame error concealment process at a decoder arranged to de-quantise the vector of the plurality of coefficients.

The distortion measure may be a Euclidean distance between the vector of the plurality of coefficients and the vector of the plurality of recovered coefficients.

Alternatively, the distortion measure may be a L1-norm distance between the vector of the plurality of coefficients and the vector of the plurality of recovered coefficients.

The vector of the plurality of coefficients may be a vector of a plurality of coefficients representative of a plurality of spectral coefficients of the frame of audio samples.

The vector of the plurality of coefficients representative of the plurality of spectral coefficients of the frame of audio samples may be a vector of a plurality of line spectral frequencies.

BRIEF DESCRIPTION OF DRAWINGS

For better understanding of the present invention, reference will now be made by way of example to the accompanying drawings in which:

FIG. 8a shows schematically a flow diagram illustrating the operation of the vector quantiser 406 shown in FIG. 4 according to some yet further embodiments;

FIG. 8b an example of a plurality of sets of basis codevectors; and

FIG. 8c an example process of determining a codevector.

DESCRIPTION OF SOME EMBODIMENTS OF THE APPLICATION

Figure 1:
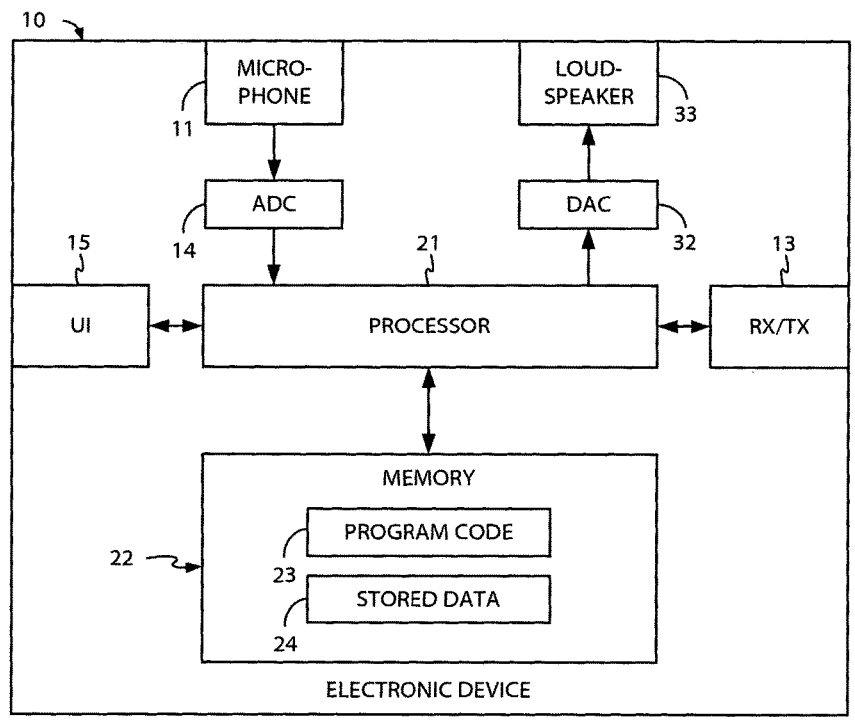
FIG. 1 shows schematically an apparatus suitable for employing some embodiments.

The following describes in more detail possible codec mechanisms for the provision of vector parameter quantisation in audio and speech codecs. In this regard reference is first made to FIG. 1 which shows a schematic block diagram of an exemplary electronic device or apparatus 10, which may incorporate a codec according to embodiments of the application.

The apparatus 10 may for example be a mobile terminal or user equipment of a wireless communication system. In other embodiments the apparatus 10 may be an audio-video device such as video camera, a Television (TV) receiver, audio recorder or audio player such as a mp3 recorder/player, a media recorder (also known as a mp4 recorder/player), or any computer suitable for the processing of audio signals.

The apparatus 10 in some embodiments comprises a microphone 11, which is linked via an analogue-to-digital converter (ADC) 14 to a processor 21. The processor 21 is further linked via a digital-to-analogue (DAC) converter 32 to loudspeakers 33. The processor 21 is further linked to a transceiver (RX/TX) 13, to a user interface (UI) 15 and to a memory 22.

The processor 21 may be configured to execute various program codes. The implemented program codes in some embodiments comprise an audio encoding code for encoding a lower frequency band of an audio signal and a higher frequency band of an audio signal. The implemented program codes 23 in some embodiments further comprise an audio and speech decoding code. The implemented program codes 23 can in some embodiments be stored for example in the memory 22 for retrieval by the processor 21 whenever needed. The memory 22 could further provide a section 24 for storing data, for example data that has been encoded in accordance with embodiments of the application.

The encoding and decoding code in embodiments can be implemented in hardware or firmware.

The user interface 15 enables a user to input commands to the apparatus 10, for example via a keypad, and/or to obtain information from the apparatus 10, for example via a display. In some embodiments a touch screen may provide both input and output functions for the user interface. The apparatus 10 in some embodiments comprises a transceiver 13 suitable for enabling communication with other apparatus, for example via a wireless communication network.

It is to be understood again that the structure of the apparatus 10 could be supplemented and varied in many ways.

A user of the apparatus 10 for example can use the microphone 11 for inputting speech or other audio signals that are to be transmitted to some other apparatus or that are to be stored in the data section 24 of the memory 22. A corresponding application in some embodiments can be activated to this end by the user via the user interface 15. This application in these embodiments can be performed by the processor 21, causes the processor 21 to execute the encoding code stored in the memory 22.

The analogue-to-digital converter (ADC) 14 in some embodiments converts the input analogue audio signal into a digital audio signal and provides the digital audio signal to the processor 21. In some embodiments the microphone 11 can comprise an integrated microphone and ADC function and provide digital audio signals directly to the processor for processing.

The processor 21 in such embodiments then can process the digital audio signal in the same way as described with reference to FIGS. 3 to 5.

The resulting bit stream can in some embodiments be provided to the transceiver 13 for transmission to another apparatus. Alternatively, the coded audio or speech data in some embodiments can be stored in the data section 24 of the memory 22, for instance for a later transmission or for a later presentation by the same apparatus 10.

The apparatus 10 in some embodiments can also receive a bit stream with correspondingly encoded data from another apparatus via the transceiver 13. In this example, the processor 21 may execute the decoding program code stored in the memory 22. The processor 21 in such embodiments decodes the received data, and provides the decoded data to a digital-to-analogue converter 32. The digital-to-analogue converter 32 converts the digital decoded data into analogue audio data and can in some embodiments output the analogue audio via the loudspeakers 33. Execution of the decoding program code in some embodiments can be triggered as well by an application called by the user via the user interface 15.

The received encoded data in some embodiments can also be stored instead of an immediate presentation via the loudspeakers 33 in the data section 24 of the memory 22, for instance for later decoding and presentation or decoding and forwarding to still another apparatus.

It would be appreciated that the schematic structures described in FIGS. 4 to 8 represent only a part of the operation of an audio codec as exemplarily shown implemented in the apparatus shown in FIG. 1.

Figure 2:
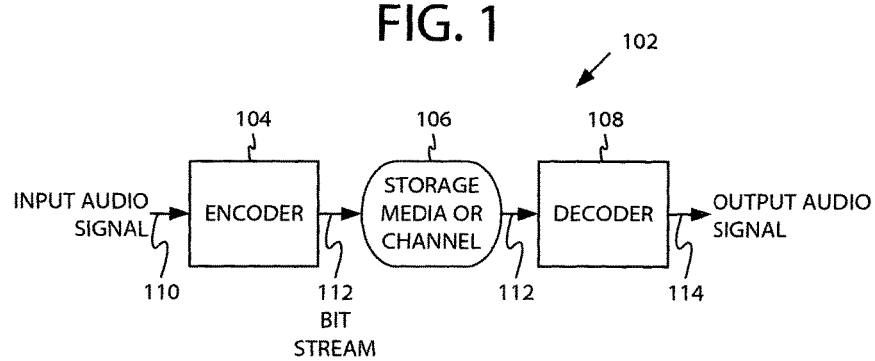
FIG. 2 shows schematically an audio codec system suitable employing some embodiments.

The general operation of audio codecs as employed by embodiments of the application is shown in FIG. 2. General audio and speech coding comprise an encoder, as illustrated schematically in FIG. 2. Illustrated by FIG. 2 is a system 102 with an encoder 104, and a storage or media channel 106. It would be understood that as described above some embodiments of the apparatus 10 can comprise or implement an encoder 104.

The encoder 104 compresses an input audio signal 110 producing a bit stream 112, which in some embodiments can be stored or transmitted through a media channel 106. The bit stream 112 can be received within the decoder 108. The decoder 108 decompresses the bit stream 112 and produces an output audio signal 114. The bit rate of the bit stream 112 and the quality of the output audio signal 114 in relation to the input signal 110 are the main features which define the performance of the coding system 102.

Figure 4:
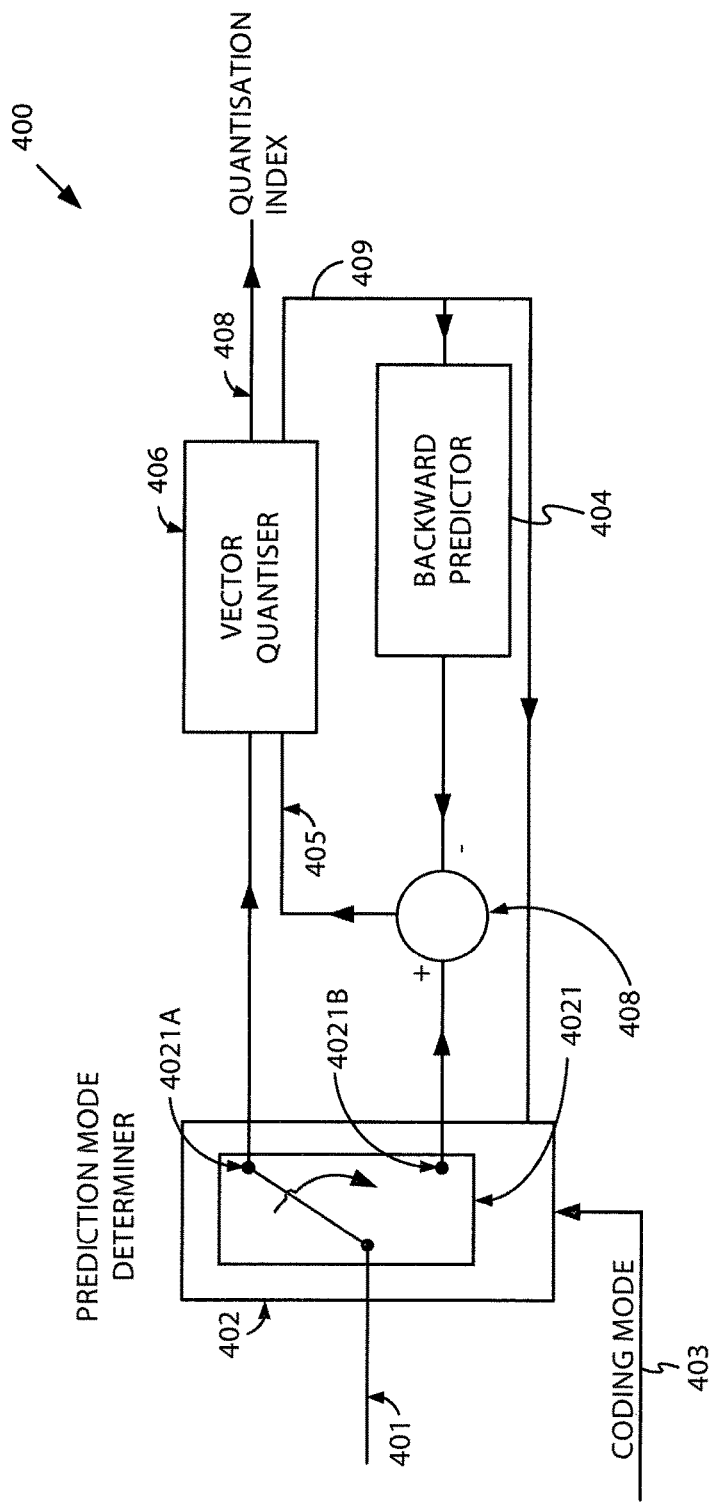
FIG. 4 shows schematically a quantiser part of the audio codec system shown in FIG. 2 according to some embodiments.

FIG. 4 shows schematically some components of the encoder 104 according to some embodiments. Components of the encoder 104 may comprise a quantiser 400 within an input 401 arranged to receive an input vector for quantisation.

The quantiser 400 can map each input vector 401 to one of a series of finite definite quantised values in order to produce a quantised vector. The quantised vector value may then be referenced by an index value. The index value may then be converted to a binary number in order to facilitate its storage and transmission.

As an example, a first quantised representation may comprise a quantising a vector of Line Spectral Frequency (LSF) values for an audio frame. In other words the first quantised representation may represent a quantised LSF vector of the input LSF vector. The first quantised representation being a quantisation index.

The first quantisation representation may be determined by means of a first quantisation stage being performed based on a plurality of codevectors, wherein the codevector is chosen to match the input vector. This plurality of codevectors of the quantisation stage may be in the form of a codebook, and the index of the chosen codevector may be the quantisation representation of the input vector.

In a predictive quantisation stage the quantised past input vectors from previous input frames can each be formed based on a chosen codevector from the at least one codebook. These quantised past input vectors may be used by a predictor to predict a current input vector. Therefore, it is to be appreciated that a predictor of a predictive quantisation stage can have a memory comprising previous quantised past input vectors.

In some embodiments the prediction coefficients used to weight past quantised LSF vectors in order to predict a current LSF value may be fixed for all input LSF vectors.

The prediction of the input vector by the predictor of the predictive quantisation stage may be used to form a residual input vector. For instance, the residual input vector may be formed by determining an error vector between the input vector and the predicted vector. As an example, the residual input vector may be formed by determining a difference between the input vector and the predicted vector.

The residual vector may form the input vector to the first quantization stage.

In some embodiments the predictor may be switched in or out of the vector quantization loop. For instance, when the predictor is switched in the vector quantization loop the first quantisation stage can be arranged to receive the residual vector as input. In the case when the prediction stage is switched out of the vector quantization loop the first quantization stage can be arranged to receive the input vector itself.

The inclusion of the predictor into the vector quantisation loop may be made dependent on the characteristics of the input vector.

As a non-limiting example, the input vector may represent a vector comprising Line Spectral Frequencies (LSF) of an input signal, wherein this input signal may represent at least part of an audio signal, e.g. a part of a voice signal or a part of a non-voice signal, wherein this audio signal may comprise voiced and/or unvoiced and/or generic and/or transition and/or comfort noise generated parts.

For instance when the input vector represents a vector comprising Line Spectral Frequencies (LSFs) of an input signal, wherein the input signal may represent at least part of an audio signal. The mode of operation of the quantiser 400 may be switched between a predictive mode of operation or a non-predictive mode of operation according to the characteristics of the audio signal of which the LSFs at least in part represents.

As an example, should the audio signal be of a periodic nature then the vector quantiser may want to exploit the similarities running from one frame to the next by arranging for the predictive mode to be operational within the quantization loop.

Conversely when the audio signal is of a non-periodic non repetitive nature the vector quantiser may not work so efficiently in a predictive mode of operation and it may be more operationally beneficial to operate the vector quantiser without the predictor.

It is to be appreciated that whilst the vector quantiser is used in a predictive mode of operation, in other words where the predictor is operational within the quantization loop, the vector quantization process can be more prone to errors. This can in part be due to the propagation of errors through the memories of the predictor, an effect which is exacerbated by the number of consecutive input vectors over which the predictor is operational.

In order to improve the stability of the vector quantiser, especially during periods when the predictor is used, the vector quantiser may be periodically switched back into a non-predictive mode of operation in order to reset the memories of the predictor.

It is to be appreciated therefore that the non-predictive mode of operation of the vector quantiser may also be known as a safety-net mode.

In other words the vector quantiser can be arranged to operate in two modes of operation comprising first a predictive mode which may be best suited for audio signals comprising of periodic or repetitive content, and a second non-predictive (safety-net) mode which may be used for either resetting the memories of the predictor or for use during regions of the audio signal which are not repetitive in nature.

With reference to FIG. 4 where it is shown the block diagram of the quantiser 400. The input line 401 may be connected to the input of the prediction mode determiner 402.

In embodiments the prediction mode determiner 402 may be arranged to determine whether the input vector should be quantised using either the predictive mode or the non-predictive (safety-net) mode.

In order to facilitate the decision of whether the prediction mode determiner 402 should determine that the quantiser 400 should be used in a predictive mode of operation or in a non-predictive (safety-net) mode of operation the prediction mode determiner 402 may be arranged to receive a further input 403. The further input 403 may convey to the prediction mode determiner 402 the type of coding regime (or coding mode) used to encode the input audio signal 110 to the encoder 104. In other words, it is to be appreciated that the encoder 104 may operate in one of a number of modes of operation, where each mode of operation can be tailored to suit a particular type of input audio frame.

The coding mode of the encoder 104 may be used at least in part to determine whether the quantiser 400 may be used in either the predictive mode of operation or in non-predictive (safety net) mode of operation.

By way of an example Table 1 below outlines a group of possible coding modes of the encoder 104 and for each of the possible mode of operation there is indicated whether the predictor should be used in the quantiser 400.

TABLE 1

| Mode | Coder Type | Predictor Selection |
|---|---|---|
| 0 | Unvoiced Wide Band | 0 |
| 1 | Unvoiced Narrow Band | 0 |
| 2 | Voiced Wide Band | 1 |
| 3 | Voiced Narrow Band | 1 |
| 4 | Generic Wide Band | 1 |
| 5 | Generic Narrow Band | 1 |
| 6 | Transition Wide Band | 0 |
| 7 | Transition Narrow Band | 0 |
| 8 | Generic Wide Band, 16 kHz | 1 |
| 9 | Transition Wide Band, 16 kHz | 0 |
| 10 | Audio Wide Band | 1 |
| 11 | Audio Narrow Band | 1 |
| 12 | Audio Wide Band, 16 kHz | 1 |
| 13 | Comfort Noise Generation | 0 |

From Table 1 above it can be seen that the predictor can be selected for certain coder types and not for others. In this example, coder types can signify a particular category of input audio signal 110. In other words a particular category of audio signal may be encoded using a specific coding type.

In embodiments the prediction mode determiner 402 may also determine that the decision to quantise the input vector using either the predictive mode or non-predictive (safety-net) mode can be dependent on other factors.

For instance, the decision to quantise the input vector using the predictive mode of operation in the quantiser 400 can be related to the performance of the corresponding de-quantiser at the decoder during a frame erasure event.

When an encoded frame is lost during transmission the decoder typically enters into a frame erasure mode of operation whereby missing or corrupted quantised vectors may have to be recovered from previously received quantised vectors. However, one consequence of using recovered quantised vectors is that the content of the predictor memories at the encoder and decoder may no longer have the same values. In other words the predictor memories of the vector quantiser at the encoder and decoder may no longer be in synchronisation with each other.

It is to be appreciated therefore that as a result of a frame erasure event the predictor memory of the vector quantiser at the encoder and the predictor memory of the vector quantiser at the decoder will remain out of synchronisation for all subsequent audio frames until the vector quantiser switches to the non-predictive (safety-net mode) of operation.

Embodiments of the invention may now be described in terms of an input vector 401 comprising a plurality of LSF coefficients. It is to be appreciated that embodiments described herein may encompass input vectors of other types of coefficients associated with audio coding. For example, other types of coefficients associated with audio coding may include other spectral representations of the audio signal such as Log Area Ratios (LAR), Reflection Coefficients or discrete cosine transform (DCT) coefficients and variants thereof such as modified discrete cosine transform (MDCT) coefficients and discrete Fourier transform (DFT) coefficients.

In some operating instances having a memory mismatch between the vector quantiser predictor memory at the encoder and the vector quantiser predictor memory at the decoder may result in undesirable artefacts in the overall decoded audio signal. This may in part be due to a large discrepancy between the quantised vectors generated as a result of prediction at the encoder and the quantised vectors generated as a result of prediction at the decoder when a frame erasure event has occurred.

In embodiments the prediction mode determiner 402 may select according to the effect of a frame erasure event whether the input LSF vector should be quantised using predictive mode or non-predictive (safety-net) mode.

Figure 5:
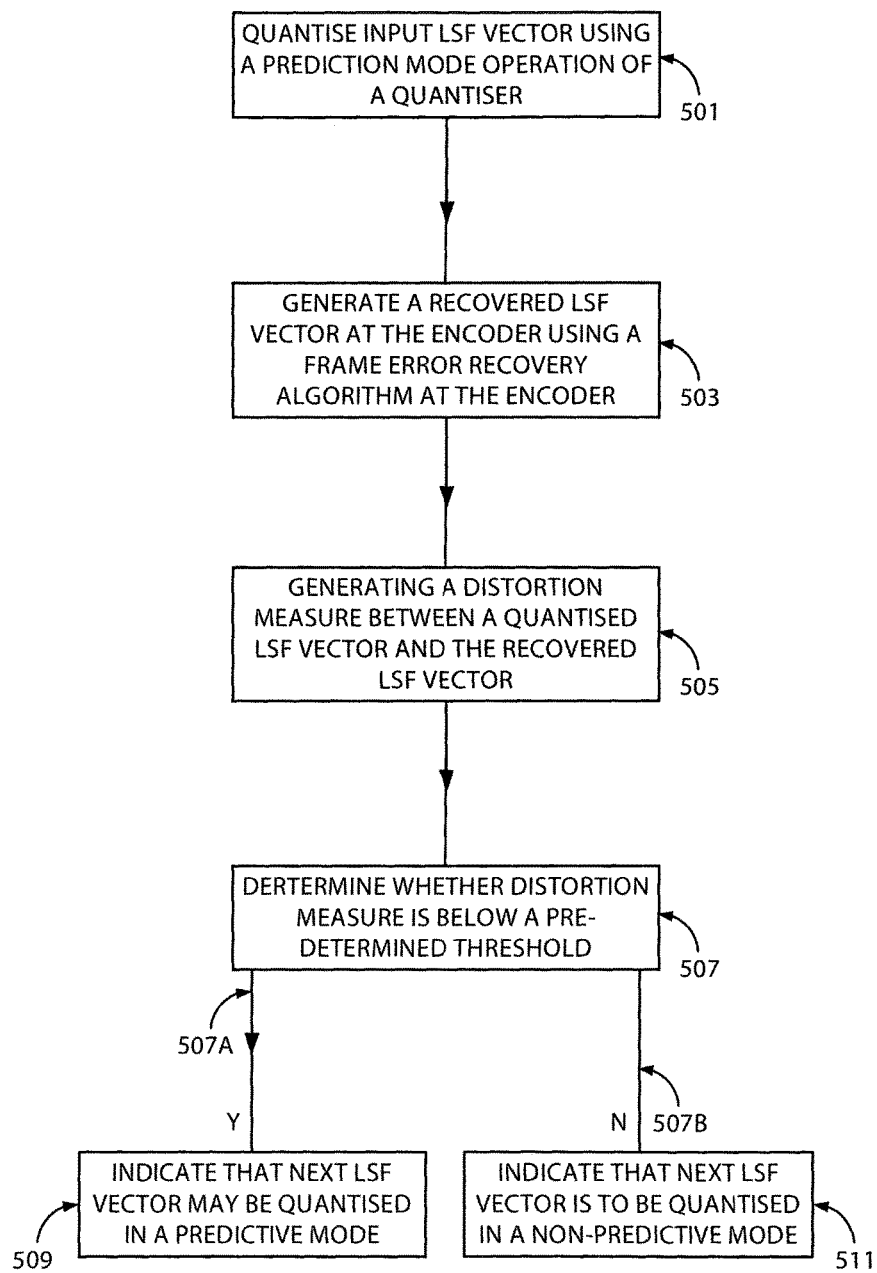
FIG. 5 shows schematically a flow diagram illustrating the operation of the quantiser 400 shown in FIG. 4 according to some embodiments.

With reference to FIG. 5 there is shown a flow diagram depicting at least in part some of the operations of the quantiser 400 according to embodiments of the invention.

Initially, for an input audio frame, the quantiser 400 may quantise the input LSF vector conveyed via the input 401 using the predictor 404. In other words a predicted LSF vector may be generated by the predictor 404 and passed to the summer 408. The summer 408 may then determine the difference between the input LSF vector 401 and the predicted LSF vector to provide a residual LSF vector 405.

It is to be appreciated that the residual LSF vector 405 may also be known in embodiments as the error vector.

The residual LSF vector 405 may then be vector quantized by the vector quantiser 406. The output from the vector quantiser 406 may be the quantisation index 408 representing the quantised residual LSF vector 405. In addition there may be a further output 409 from the vector quantiser 406 which may comprise the quantised LSF vector.

With reference to FIG. 4, the quantised LSF vector 409 may be passed to the predictor 404 in order to populate the predictor memory. The predictor memory may be then used to generate the predicted LSF vector for subsequent input LSF vectors.

With further reference to FIG. 4, the quantized LSF vector 409 may also be passed to the prediction mode determiner 402 in order to assist in the process of determining the mode of operation of the quantiser 400 for the current input LSF vector 401.

The step of quantizing the input LSF vector 401 by the quantiser 400 in a predictive mode of operation to produce the quantised LSF vector and a quantisation index 408 representing the quantised input LSF vector for a current audio frame is shown as processing step 501 in FIG. 5.

In other words there is provided means for quantising a vector of a plurality of coefficients using a predictive mode of operation of a vector quantiser, wherein the vector quantiser can operate in either a predictive mode of operation or a non-predictive mode of operation, and wherein the plurality of coefficients are associated with a frame of audio samples.

The prediction mode determiner 402 may then determine for the current audio frame the recovered LSF vector which would be generated at the decoder when a frame erasure event occurs.

In other words, for the current audio frame the prediction mode determiner 402 may then determine a locally generated recovered LSF vector at the encoder by using the same frame error recovery algorithm as that used by the decoder when a frame erasure event has occurred.

The step of generating a recovered LSF vector at the encoder by using a frame error recovery algorithm used in a frame erasure event is shown as processing step 503 in FIG. 5.

In other words there is provided means for determining a vector of a plurality of recovered coefficients which correspond to the vector of the plurality of coefficients when the vector of the plurality of coefficients is subjected to a frame erasure event.

The prediction mode determiner 402 may then compare the quantized LSF vector as produced during the processing of step 501 to the recovered LSF vector produced as a result of the frame error recovery algorithm, the frame error recovery algorithm being executed within the encoder 104.

In other words there may be provided for embodiments means for comparing a vector of plurality of coefficients to a vector of plurality of recovered coefficients.

In embodiments the above comparison may be performed in the prediction mode determiner 402 by determining a distortion measure between the quantized LSF vector and the recovered LSF vector.

In embodiments the distortion measure may be based on any kind of suitable distance between the quantised LSF vector and the recovered LSF vector. As an example, a L1-norm distance or a Euclidean distance or any other distance may be used.

The step of generating the distortion measure between the quantized LSF vector and the recovered LSF vector as part of a frame error recovery algorithm operating in the event of a frame erasure process is shown as processing step 505 in FIG. 5.

In embodiments there may be provided means for determining a distortion between a vector of a plurality of coefficients and a vector of a plurality of recovered coefficients.

The prediction mode determiner 402 may then determine that the determined distortion measure falls within the bounds of a pre-determined threshold value. The result of the said determination may be used by the prediction mode determiner 402 in order to determine whether the LSF vector for the next audio frame should be either quantised using the predictive mode of operation or the non-predictive (safety-net) mode of operation.

For instance, in some embodiments if it is determined that the distortion measure is less than a pre-determined threshold value then the prediction mode determiner 402 may determine that the next (subsequent) LSF vector can be quantised using a predictive mode of operation.

In some embodiments the next LSF vector may be the LSF vector associated with the next audio frame.

In some further embodiments the determination that the distortion measure is less than the pre-determined threshold value may be used as an indication that the next (subsequent) LSF vector may be quantised using the vector quantiser in a predictive mode of operation. In these embodiments the next LSF vector conveyed along the input 401 may then be quantised by using the vector quantiser 400 in the predictive mode of operation. Furthermore, the same next LSF vector as conveyed on the input 401 may also be quantised by using the vector quantiser 400 in the non-predictive (safety net) mode of operation.

For these embodiments, in which the distortion measure is less that the pre-determined threshold value, the quantised next LSF vector can be selected to be either the next LSF vector which is quantised by using the quantiser 400 in the predictive mode of operation, or the next LSF vector which is quantised by using the quantiser 400 in the non-predictive (safety-net) mode of operation.

The selection between the next LSF vector which is quantised using the predictive mode of operation and the next LSF vector which is quantised using the non-predictive mode of operation may be made based on the quantisation error. In other words the next LSF vector which is quantised may be determined to be the quantised LSF vector which has the smallest quantisation error.

In embodiments the quantisation error may be formulated as the mean square error between the LSF vector and the quantised LSF vector.

Conversely, in the instance that the prediction mode determiner 402 determines that the distortion measure is equal to or greater than the pre-determined threshold, the prediction mode determiner 402 may determine that the next LSF vector can be quantised using the non-predictive (safety-net) mode of operation.

With reference to FIG. 4, the selection between predictive mode of operation and the non-predictive (safety-net) mode of operation is shown as the switch configuration 4021 within the prediction mode determiner 402.

For example, when the switch 4021 is in a first position 4021A then the input LSF vector 401 is passed directly into the vector quantiser 406 thereby bypassing the predictor 404. When the switch 4021 is in a second position 4021 B then the input LSF vector 402 is passed to the input of the summer 408 whereby the predicted quantised LSF is subtracted from the input vector 401 to provide the residual LSF vector 405.

In some embodiments the prediction mode determiner 402 may provide a mean removed LSF vector to the vector quantiser 406. For instance, when operating in a non-predictive (safety-net) mode of operation the LSF vector conveyed to the vector quantiser 406 may be a mean removed LSF vector.

As an example in the non-predictive (safety-net) mode of operation, a pre-calculated mean LSF vector may be subtracted from the LSF vector before the LSF vector is passed to the vector quantiser 406. In other words, each component of the LSF vector may have a component mean value subtracted from it before being vector quantised by the vector quantiser 406.

The mean LSF vector may be fixed for all LSF vectors and pre-calculated using a training database.

It is to be appreciated that the value of the pre-determined threshold can be chosen such that when the quantised LSF vector and the recovered LSF vector are sufficiently close to each other, it can be deemed that a frame erasure event at the decoder may not produce annoying artefacts in the decoded audio signal when the LSF quantiser is operating in a predictive mode of operation for the quantisation of the next LSF vector Conversely, it is to be appreciated that the value of the pre-determined threshold can be chosen such that when the quantised LSF vector and the recovered LSF are sufficiently far apart from each other, it can be deemed that a frame erasure event at the decoder may produce annoying artefacts in the decoded audio signal when the LSF quantiser is operating in a predictive mode of operation. In this instance the vector quantiser at the encoder can switch to a non-predictive (safety-net) mode of operation for the quantisation of the next LSF vector.

Furthermore, in some embodiments the decision of whether to use a predictive mode of operation or non-predictive of operation for the next LSF vector may also be further dependent on the coding mode chosen to encode the next input audio frame, and whether the said coding mode if of a type which allows the predictive mode of operation to be used. For example with reference to Table 1, only the coding modes 2, 3, 4, 5, 8, 10, 11 and 12 would allow the predictive mode of operation to be selected.

It is to be appreciated therefore in these embodiments the quantiser 400 may be selected to operate in a predictive mode of operation for the next LSF vector when both the above conditions are met. In other words when the determined distance measure is below the pre-determined threshold value and the coding mode selected during the processing of the next audio frame allows for the predictor to be used.

Further still, in some embodiments the result that the distortion measure is below the pre-determined threshold value for the LSF vector of an audio frame may be used as an indicator that the predictive mode of operation may be used for quantising the LSF vector for the next audio frame. In such embodiments, the final decision as to whether to use the predicted quantised LSF vector or the non-predicted quantised LSF vector for the next audio frame may be taken during the quantisation of the LSF vector for the next audio frame. For the next audio frame the quantiser 400 may quantise the LSF vector associated with the next audio frame firstly using a predictive mode of operation and then quantize the input LSF vector again using the non-predictive (safety-net) mode of operation. The quantised LSF vector of the next audio frame may then be selected to be the quantised LSF vector which produces the smallest quantisation error.

It is to be appreciated therefore in these embodiments the comparison of the distortion measure with the pre-determined threshold is merely an indication as to whether the LSF vector of the next audio frame (the next LSF vector) can be quantised using a predictive mode of operation. The actual final decision may be dependent on whether the coding mode for the next audio frame allows for the predictive mode of operation. If the coding mode for the next audio frame allows for the use of the predictive mode, the quantiser 400 may then quantise the LSF vector of the next audio frame in both a predictive mode and a non-predictive mode. The quantised LSF vector for the next audio frame may then be determined to be either the quantised LSF vector obtained via the non-predictive mode of operation or the quantised LSF vector obtained via the predictive mode of operation depending on which mode of operation produces the smallest quantisation error.

With reference to FIG. 5 the step of determining whether the distortion measure is below the pre-determined threshold is shown as decision step 507.

With further reference to FIG. 5, the decision step 507 has two outputs. The first output branch 507a indicates that the distortion measure is below the pre-determined threshold This first decision instance may result in the indication by the prediction mode determiner 402 that the next input LSF vector may be quantised using the quantiser 400 in a predictive mode of operation The step of determining an indication that the LSF vector for the next audio frame (next LSF vector) may be vector quantised using the predictive operational mode is shown as processing step 509 in FIG. 5.

In embodiments the above indication may be stored in memory in order that it may be retrieved during the processing of the audio frame.

The second output branch 507b indicates that the distortion measure is either equal to higher than the pre-determined threshold.

This second decision instance may result in the determination that the next input LSF vector can be quantised using the non-predictive (safety-net) mode of operation. The step of determining that the next LSF vector is to be vector quantised using the non-predictive (safety-net) mode of operation is shown as processing step 511 in FIG. 5.

In other words there may be provided means for determining a mode of operation of a vector quantiser for a vector of a plurality of coefficients associated with a subsequent frame of audio samples, in which the mode of operation is dependent on a comparison between a vector of plurality of coefficients and a vector of a plurality of recovered coefficients for a frame of audio samples.

Figure 3:
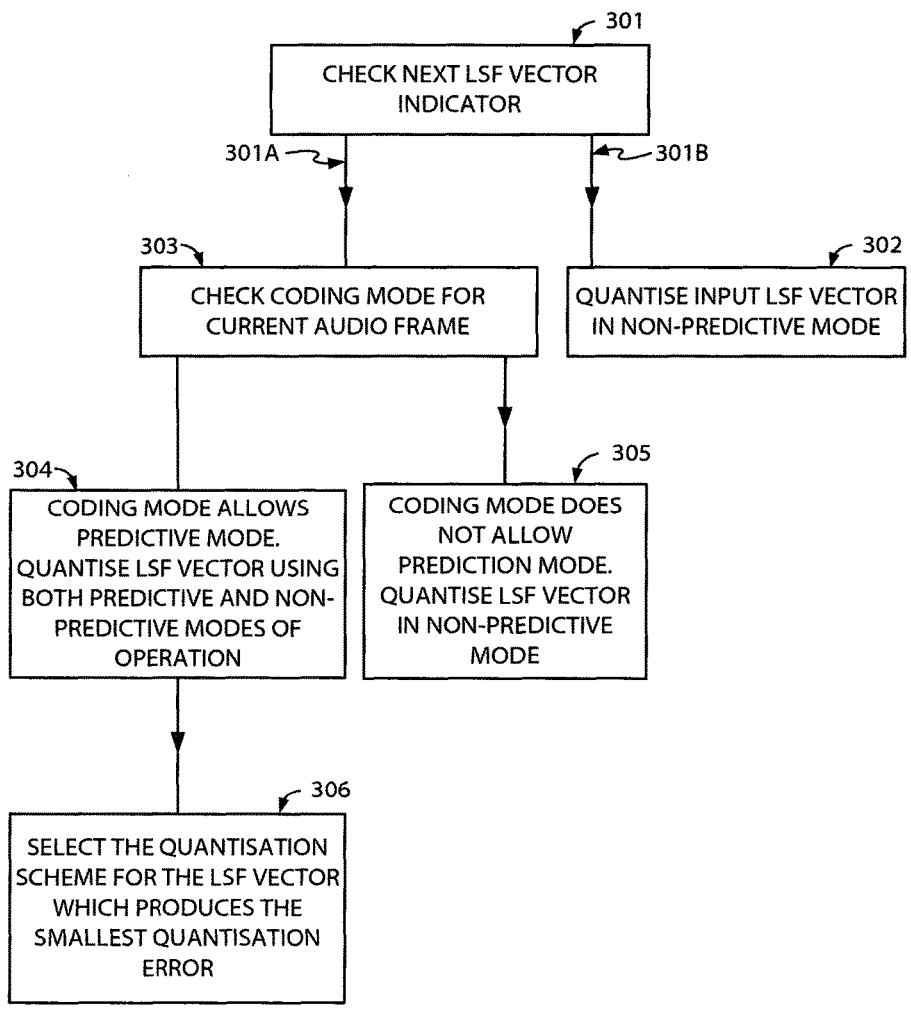
FIG. 3 shows schematically a flow diagram illustrating the operation of the quantiser 400 shown in FIG. 4 for an audio frame subsequent to the processing of an audio frame by the quantiser 400 according to the flow diagram of FIG. 5.

With reference to FIG. 3 there is shown a flow diagram depicting at least in part some of the operations of the quantiser 400 for the quantisation of the LSF vector for the next audio frame, in other words the next LSF vector.

It is to be understood herein that the description accompanying FIG. 3 relates to quantising the subsequent (or next) input LSF vector to that of the input vector processed according to the flow chart of FIG. 5. Accordingly, the input vector of FIG. 3 may be viewed as the next LSF vector to that of the LSF vector of FIG. 5.

It is to be further understood that the LSF vector referred to in the accompanying description associated with FIG. 3 may be the LSF vector of an input audio frame which is a next input audio frame to that referred to in FIG. 5.

When quantising the LSF vector for the next audio frame the prediction mode determiner 402 may initially check the next LSF vector indicator as determined during processing steps 509 and 511. In FIG. 3 this checking step is shown as the processing step 301.

If it is determined at processing step 301 that the next LSF vector indicator indicates that the next LSF vector should be quantised by the quantiser 400 in a non-predictive (safety-net) mode of operation then the decision branch 301b is taken.

The decision branch 301b leads to the processing step 302 in which the prediction mode determiner 402 ensures that the input LSF vector (in other words the next LSF vector) is quantised in a non-predictive mode of operation.

If it is determined at processing step 301 that the next LSF indicator does indicate that the next LSF vector may be quantised by the quantiser 400 in a predictive mode of operation then the decision branch 301a is taken.

As a result of decision instance 301a the processing step 303 is performed in which the prediction mode determiner 402 may check the coding mode for the current audio frame.

The coding mode is conveyed to the quantiser 400 along the input line 403 FIG. 4.

If the prediction mode determiner 402 determines at the checking step 303 that the coding mode of the current audio frame does not allow for the quantiser 400 to be used in a predictive mode of operation then the decision instance branch 303b is taken. The prediction mode determiner 402 may then ensure that the input LSF vector (in other words the next LSF vector) is quantised in a non-predictive mode of operation as depicted by processing step 305.

If however the prediction mode determiner 402 determines at the checking step 303 that the coding mode of the current audio frame does allow for prediction to be used in the quantiser 400 then the decision instance branch 303a may be taken. Consequently as a result of this decision instance 303a the input LSF vector may be quantised by using the quantiser 400 in a predictive mode of operation and further the input LSF vector may also be quantised by using the quantiser 400 in a non-predictive (safety-net) mode of operation as depicted by processing step 304.

The quantiser 400 may then determine both the quantisation error for the quantised LSF vector obtained as a result of the quantiser operating in a predictive mode and the and the quantiser error for the quantised LSF vector obtained as a result of the quantiser operating in a non-predictive (safety-net) mode. The quantiser 400 may then select the particular quantised LSF vector according to which particular mode of operation of the quantiser 400 produces the smallest quantisation error.

It is to be understood that at least one output from the quantiser 400 may be either the quantisation index associated with the quantised LSF vector obtained as a result of the quantiser 400 operating in a predictive mode, or the quantisation index associated with the quantised LSF vector obtained as a result of the quantiser 400 operating in a non-predictive (safety-net) mode of operation.

It is to be understood that in some embodiments the quantiser 400 may operate according to just the flow diagram of FIG. 5. In other words the prediction mode determiner 402 may determine the mode of operation of the quantiser 400 for quantising the next LSF vector based solely on the comparison of the distance measure against the pre-determined threshold.

It is to be further understood that for other embodiments the quantiser 400 may operate according to the combined flow diagram of both FIGS. 5 and 3. In other words the prediction mode determiner 402 may determine the mode of operation of the quantiser 400 for quantising the next LSF vector based partly on the comparison of the distance measure against the pre-determined threshold. In addition the selected mode of operation of the quantiser 400 will also depend on the coding mode of the next audio frame and on the relative quantisation error produced by the quantiser 400 operating in both the predictive and non-predictive modes.

Figure 6:
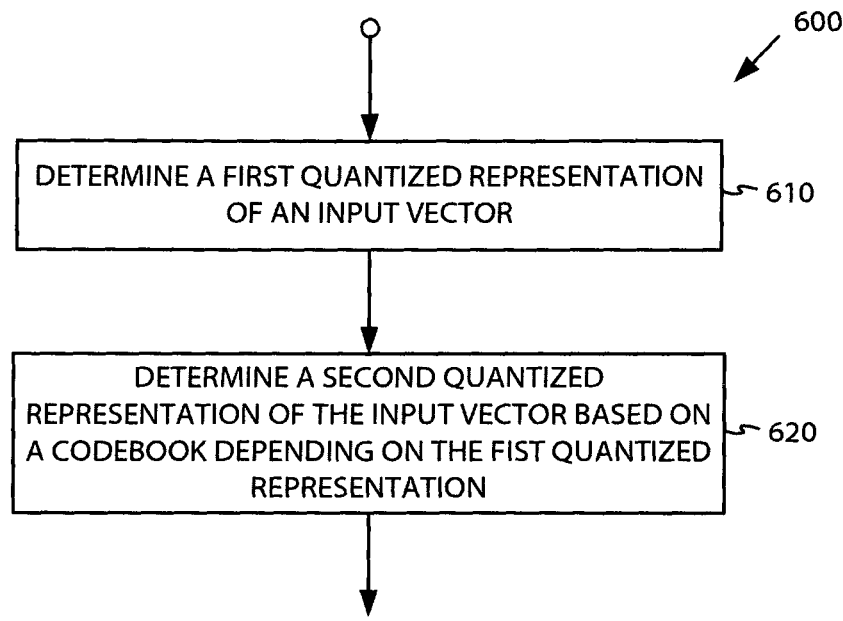
FIG. 6 shows schematically a flow diagram illustrating the operation of the vector quantiser 406 shown in FIG. 4 according to some embodiments.

With reference to FIG. 6 there is shown a flow chart 600 of a method of vector quantising the input vector which may be used by the vector quantiser 406 in some embodiments.

In a step 610, a first quantized representation of an input vector is determined. For instance, said first quantized representation may represent a quantized vector of the input vector. As an example, this quantized vector may comprise a plurality of bits, but any other well-suited quantized representation of the input vector may be used for the first quantized representation.

As a non-limiting example, the input vector may represent a vector comprising Line Spectral Frequencies (LSF) of an input signal, wherein this input signal may represent at least a part audio signal, e.g. a part of a voice signal or a part of a non-voice signal, wherein this audio signal may comprise voiced and/or unvoiced and/or generic and/or transition and/or CNG parts. For instance, the input signal to be quantized may represent residual data of an audio signal to be encoded, e.g. a residual of a Line Spectral Frequency (LSF) vector.

As an example, the first quantised representation may be determined by means of a first quantisation stage being performed based on a plurality of codevectors. This plurality of codevectors of the first quantization stage may represent a first stage codebook.

For instance, the first quantized representation may represent the codevector selected from the plurality of codevectors for quantizing the input vector. As another example, the first quantized representation may represent an identifier of the selected codevector, wherein this identifier may represent a codevector index. Thus, for instance, if the first quantized representation may comprise n bits, the first stage codebook may comprise a maximum of $2^n$ codevectors.

In a step 620, a second quantized representation of the input vector is determined based on a codebook depending on the first quantized representation.

For instance, it may be assumed that this second quantized representation is performed by means of a second quantization stage. This second quantization stage may perform a quantization based on a plurality of codebooks, wherein each of this plurality of codebooks comprises at least one codevector.

The codebook used for the quantization of the input vector in the second stage depends on the first quantized representation. Thus, as an example, the codebook used in the second stage may be selected from the plurality of codebooks of the second stage based on the first quantized representation of the input vector.

For instance, there may be defined a mapping between a codevector of the plurality of codevectors of the first stage and a codebook of the plurality of codebooks of the second stage. Accordingly, such a mapping may be defined for each codevector of the plurality of codevectors of the first stage and a respective codebook of the plurality of codebooks of the second stage. Thus, based on the first quantized representation of the input vector, wherein this first quantized representation may represent the codevector selected in the first stage or may represent in indicator of the codevector selected in the first stage, the codebook for performing quantization in the second stage may be selected from the plurality of codebooks of the second stage.

This may show the advantage that specific codebooks may be defined for the second stage, wherein each specific codebook is adapted to the quantization performed in the first stage. Thus, at least one codebook of the plurality of codebooks of the second stage may represent a specific codebook tuned for the particular residual data associated with this codebook to be encoded which may improve the coding efficiency.

For instance, the codebooks of the second stage may represent lattice codebooks.

As an example, the first quantized representation of the input vector may represent a codevector index being indicative of the codevector selected in the first stage. Then, in step 620, a codebook of the plurality of codebooks is selected which is associated with the codevector index of the first quantized representation. For instance, each codevector index of first stage may be associated with a corresponding codebook of the plurality of codebooks of the second stage.

Then, in step 620, based on the selected codebook, a codevector of the selected codebook may be determined, e.g. based on a distortion metric. For instance, the codevector of the selected codebook may be determined for quantizing the input vector having the lowest distortion with respect to the input vector, wherein the distortion is determined based on the distortion metric. As an example, the distortion metric may represent a distance between the codevector and the input vector. For instance, a L1-norm distance or an Euclidian distance or any other distance may be used.

In some embodiments a further quantized representation of the input vector may be determined based on a codebook depending on a previous quantized representation. In other words, this further quantised representation can be performed by means of a further quantisation stage. The further quantization stage may perform the quantisation on a plurality of codebooks.

The number of quantisation stages of the vector quantiser 406 can also vary according to the type encoding mode used by the encoder 104 to encode the input audio signal.

Figure 7:
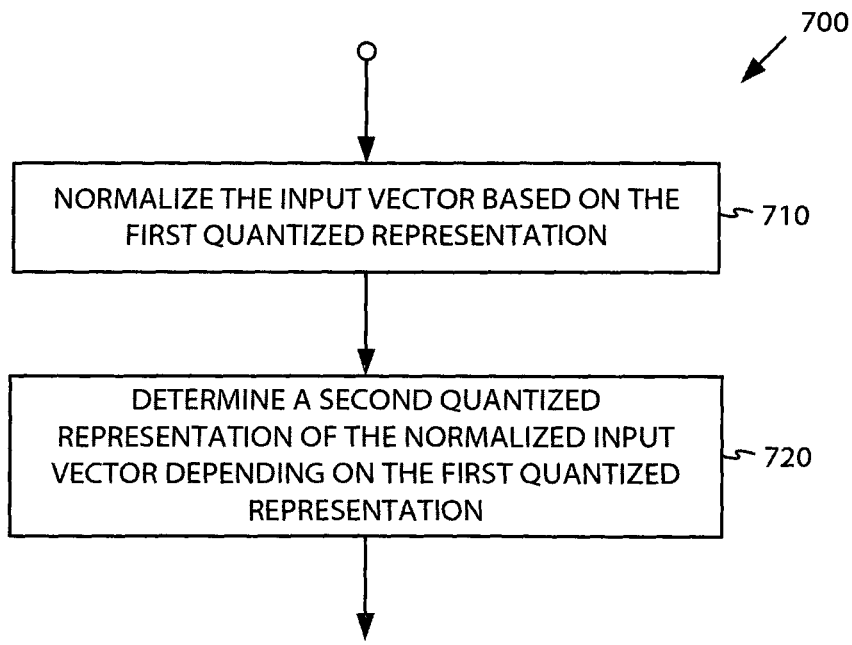
FIG. 7 shows schematically a flow diagram illustrating the operation of the vector quantiser 406 shown in FIG. 4 according to some further embodiments.

With reference to FIG. 7 there is shown a flow chart 700 of a further method of vector quantising the input vector according to the vector quantiser 406.

For instance, this method 700 may be used for determining the second quantized representation of the input vector in step 620 of method 600 depicted in FIG. 6.

In a step 710, the input vector is normalized based on the first quantized representation. For instance, said normalizing may comprise multiplying the vector components of the input vector with normalization coefficients in order to obtain a normalized representation of the input vector, where the normalization coefficients depend on the first quantized representation of the input vector.

The normalization is performed based on the first quantized representation. For instance, there may be defined a plurality of sets of normalization coefficients, each set of normalization coefficients comprising at least one normalization coefficient to be used for normalizing the input vector, wherein one set of normalization coefficients is selected from the plurality of sets of normalization coefficients based on the first quantized representation of the input vector.

For instance, there may be defined a mapping between a codevector of the plurality of codevectors of the first stage and a set of normalization coefficients of the plurality of sets of normalization coefficients. Accordingly, such a mapping may be defined for each codevector of the plurality of codevectors of the first stage and a respective set of normalization coefficients of the plurality of normalization coefficients. Thus, based on the first quantized representation of the input vector, wherein this first quantized representation may represent the codevector selected in the first stage or may represent in indicator of the codevector selected in the first stage, the set of normalization coefficients for performing normalization of the input vector in step 710 may be selected from the plurality of sets of normalization coefficients.

As an example, if the input vector comprises n vector coefficients, a set of normalization coefficients may comprise n normalization coefficients. Then, normalization of the input vector may be performed by multiplying a vector component of the plurality of vector components of the input vector with an associated normalization coefficient of the selected set of normalization coefficients. This may be performed for each vector component of the input vector, wherein a respective vector component is multiplied with the respective normalization coefficients of the set of normalization coefficients in order to obtain a normalized representation of the input vector.

As an example, the first quantized representation of the input vector may represent a codevector index being indicative of the codevector selected in the first stage. Then, in step 710, a set of normalization coefficients of the plurality of sets of normalization coefficients is selected which is associated with the codevector index of the first quantized representation. For instance, each codevector index of first stage may be associated with a corresponding set of normalization coefficients of the plurality of sets of normalization coefficients.

Then, in a step 720 the second quantized representation of the normalized input vector is determined depending on the first quantized representation. Determining the second quantized representation in step 720 may be performed as described with respect to step 620 in FIG. 6, wherein the input vector used in step 620 is replaced with the normalized input vector obtained in step 710.

FIG. 8a depicts a flowchart 800 of a further method of vector quantising the input vector according to the vector quantiser 406.

For instance, this method 800 may be used for determining the second quantized representation of the input vector in step 620 of method 600 depicted in FIG. 6 or for determining the second quantized representation of the normalized input vector in step 720 in FIG. 7.

In a step 810, a codebook is selected of a plurality of codebooks based on the first quantized representation. For instance, this selection may be performed as explained with respect to the example embodiment of a method 600.

Each codebook of the plurality of codebooks is defined by an associated set of basis codevectors and an associated at least one scale representative.

Each set of basis codevectors comprises at least one basis codevector. Since each set of basis codevectors is associated with at least one scale representative of a plurality of scale representatives, a codevector can be determined based on a basis codevector of a set of potential basis codevectors and a scale representative of the at least one scale representative associated with the set of potential basis codevectors, i.e. the codevector may be represented based on a basis codevector scaled by the respective scale representative. For instance, the scale representative may represent a scale value, wherein a codevector may be determined based on a multiplication of a basis codevector and the respective scale value.

For instance, at least one set of basis codevectors is associated with at least two scale representatives.

Accordingly, as an example, a codebook may comprise a set of codevectors comprising codevectors based on the plurality of sets of basis codevectors and based on the respective at least one scale value associated with a respective set of basis codevectors of the plurality of basis codevectors. This set of codevectors may comprise, for each basis codevector of each set of basis codevectors and for each of the at least one scale representative associated with a respective set of basis codevectors, a codevector based on the respective basis codevector scaled by the respective scale representative.

For instance, said sets of basis codevectors may represent leader classes, wherein each leader class comprises a different leader vector and permutations of said leader vector. Thus, said leader vector and the permutations of said leader vector may represent the basis codevectors of the respective set of basis codevectors.

The plurality of sets of basis codevectors may represent a subset of a second plurality of sets of basis codevectors. For instance, under the assumption that each set of basis codevectors represents a leader class, the plurality of leader classes may represent a subset of a second plurality of leader classes. Thus, the plurality of leader classes may be considered as a truncated plurality of leaders classes with respect to the second plurality of leader classes.

FIG. 8b depicts an example of a plurality of set of basis codevectors, wherein each $b_x$, with $x \in \{0, 1, \ldots X-1\}$, represents a set of basis codevector of the plurality of sets of basis codevectors, wherein X represent the number of sets of the plurality of sets of basis codevectors. Each set of basis codevectors is associated or comprises at least one basis codevector $b_{x,y}$, wherein $B_x$ represents the number of basis codevectors of a respective set of basis codevectors $b_x$, i.e. $y \in \{0, 1, \ldots B_x-1\}$ holds. For instance, the number $B_x$ of basis codevectors of a set of basis codevectors may be different for different sets of basis codevectors and/or it may be the same for at least two sets of basis codevectors.

FIG. 8c depicts an example process of determining a codevector $c_{x,z,y}$ based on basis codevector $b_{x,y}$ and based on a scale representative $s_z$, wherein index z represents the index of the respective scale representative of the plurality of scale representatives $s_0 \ldots s_{S-1}$, i.e. $z \in \{0, 1, \ldots S-1\}$ holds.

For instance, in case the values $b_{x,y,t}$ of the basis codevectors $b_{x,y}=[b_{x,y,0}, b_{x,y,1}, \ldots, b_{x,y,n-1}]$ represent absolute values, wherein $t \in \{0, 1, \ldots n-1\}$ holds and n represents the length of the respective basis codevector $b_{x,y}$, and if the absolute valued input vector is used for determining the potential codevector of a respective set of basis codevectors, the sign of each value $b_{x,y,t}$ at the (t+1)th position of the determined nearest basis codevector $b_{x,y}$ may be assigned based on the sign of the respective value $i_t$ at the (t+1)th position of the input vector i, before determining a codevector $c_{x,z,y}$ based on basis codevector $b_{x,y}$ and based on a scale representative $s_z$ is performed, as exemplarily depicted in FIG. 8c. As an example, if $i=[i_0, i_1, \ldots i_{n-1}]$ represents the input vector, the absolute valued input vector may be represented by $[|i_0|, |i_1|, \ldots, |i_{n-1}|]$.

For instance, the sign of each value $b_{x,y,t}$ at the (t+1)th position of the determined nearest basis codevector $b_{x,y}$ may be assigned to the sign of the respective value $i_t$ at the (t+1)th position of the input vector, respectively, wherein this may hold if the parity of the basis codevectors $b_{x,y}$ of the set of basis codevectors $b_x$ is 0. As another example, if the parity of the basis codevectors $b_{x,y}$ of the set of basis codevectors $b_x$ is −1, the signs of the values $b_{x,y,t}$ of the potential basis codevector may be assigned corresponding to the signs of the values of the input vector at the same position in the vector, respectively, and if there are not an odd number of negative components, the value $b_{x,y,t}$ in the potential basis codevector having the lowest non-null absolute value may change its sign. Or, as another example, if the parity of the basis codevectors $b_{x,y}$ of the set of basis codevectors $b_x$ is +1, the signs of the values $b_{x,y,t}$ of the potential basis codevector may be assigned corresponding to the signs of the values of the input vector at the same position in the vector, respectively, and if there are not an even number of negative components, the value $b_{x,y,t}$ in the potential basis codevector having the lowest non-null absolute value may change its sign As a non-limiting example, a codevector $c_{x,z,y}$ may be determined based on a basis codevector by $b_x$ and based on a scale representative $s_z$ by $c_{x,z,y}=[b_{x,y,0} \cdot s_z, b_{x,y,1} \cdot s_z, \ldots, b_{x,y,n-1} \cdot s_z]$.

Each of the scale representatives $s_z$, wherein $z \in \{0, 1, \ldots S-1\}$ holds, is associated with at least one set of basis codevectors. For instance, as a non-limiting example this respective at least one set of basis codevectors may be represented by the set of basis codevectors $b_x$, with $x \in \{0, 1, \ldots n_z-1\}$, wherein $n_z$ may represent the number of sets of basis codevectors associated with the respective scale representative $s_z$, wherein $0 < n_z < X$ holds. Based on this linkage between a respective scale representative $s_z$ and the associated at least one set of basis codevectors $b_x$, with $x \in \{0, 1, \ldots n_z-1\}$, the associated at least one set of codevectors $c_{x,z,y}$, with $x \in \{0, 1, \ldots n_z-1\}$ and $y \in \{0, 1, \ldots B_x-1\}$ and $z \in \{0, 1, \ldots S-1\}$, can be determined.

Thus, as an example, a codebook structure of the above mentioned codebook may be defined by the plurality of scale representatives $s_z$, the plurality of sets of basis codevectors $b_x$, and the linkage between each scale representative with the associated at least one set of basis codevectors.

Since at least one set of basis codevectors, e.g. at least the set of basis codevectors $b_0$, is associated with at least two scale representatives, the same set of basis codevectors can be used to construct codevectors of the at least one set of codevectors associated with a first scale representative and to construct codevectors of the at least one set of codevectors associated with at least one further scale representative.

For instance, the codebooks of the plurality of codebooks of step 410 may be defined based on the above-mentioned second plurality of leader classes, wherein each leader class of the second plurality of leader classes is associated with a different leader vector, and wherein a set of basis codevector associated with a respective leader class may be represented by the respective leader vector and permutations of the this leader vector. Then, as an example, each codebook of the plurality of codebooks may be defined by at least one truncation associated with a respective codebook, wherein each truncation of the at least one truncation associated with a respective codebook is associated with at least one leader class of the second plurality of leader classes and with a respective scale representative such that the leader class vector of the respective leader class scaled with respective scale representative and permutations of this scaled leader class vector represent codevectors of the respective truncation of the at least one truncation of the respective codebook.

As a non-limiting example, an example of 16 exemplary leader classes may be defined by:

```
float pl[ ]={1, 1, 0, 0, 0, 0, 0, 0,
    0.5, 0.5, 0.5, 0.5, 0.5, 0.5, 0.5, 0.5,
    1, 1, 1, 1, 0, 0, 0, 0,
    2, 0, 0, 0, 0, 0, 0, 0,
    1.5, 0.5, 0.5, 0.5, 0.5, 0.5, 0.5, 0.5,    // 5
    1, 1, 1, 1, 1, 1, 0, 0,
    2, 1, 1, 0, 0, 0, 0, 0,
    1.5, 1.5, 0.5, 0.5, 0.5, 0.5, 0.5, 0.5,
    1, 1, 1, 1, 1, 1, 1, 1,
    2, 1, 1, 1, 1, 0, 0, 0,                    // 10
    2, 2, 0, 0, 0, 0, 0, 0,
    1.5, 1.5, 1.5, 0.5, 0.5, 0.5, 0.5, 0.5,
    2.5, 0.5, 0.5, 0.5, 0.5, 0.5, 0.5, 0.5,
    2, 1, 1, 1, 1, 1, 1, 0,
    2, 2, 1, 1, 0, 0, 0, 0,                    // 15
    3, 1, 0, 0, 0, 0, 0, 0};
```

For instance, these 16 leader classes may define the above mentioned second plurality of sets of basis codevectors, wherein a codebook structure may be defined by a plurality of set of basis codevectors representing a subset of said second plurality of sets of basis codevectors.

As an example, a plurality of an example of 16 exemplary codebook structures may be defined as

```
int no_lead[ ][ ]={
    {8, 9, 3, 2, 2, 1},
    {10, 9, 3, 2, 2, 0},
    {7, 6, 2, 2, 3, 0},
    {2, 2, 1,10, 9, 2},
    {6, 2, 0, 5, 3, 0},
    {13, 3, 0, 2, 2, 0},
    {10, 9, 3, 2, 2, 0},
    {10, 9, 3, 2, 2, 0},
    {10, 9, 3, 2, 2, 0},
    {5, 3, 0, 6, 2, 0},
    {8, 5, 2, 4, 0, 0},
    {10, 9, 3, 2, 2, 0},
    {9, 9, 3, 2, 2, 2},
    {10, 9, 3, 2, 2, 0},
    {11, 9, 3, 2, 2, 0},
    {8, 10, 7, 2, 2, 0}};
``` wherein each vector no_lead[ ][I] (wherein I∈{0, 1, . . . 16 holds) defines a respective codebook structure comprising a plurality of truncations. For instance, with I=2 the vector no_lead[ ][2]=(10, 9, 3, 2, 2, 0) defines respective codebook structure signifying that the first truncation, i.e., the first union of leader classes, may be composed of the first 8 leader classes, the second one by the first 9 leader classes, the third one by the first 3 leader classes, and so on.

To each truncation of a respective codebook structure a respective scale representation may be assigned (e.g. through training), e.g.:

```
float scales[ ][16]={
  {0.947f, 1.574f, 2.432f, 1.281f, 2.249f, 5.562f},
  {0.887f, 1.635f, 2.626f, 1.263f, 2.736f, 0.0f},
  {1.005f, 1.683f, 3.539f, 1.071f, 1.895f, 0.0f},
  {1.055f, 2.491f, 6.473f, 0.959f, 1.930f, 2.455f, },
  {1.195f, 3.650f, 0.0f, 1.225f, 2.172f, 0.0f},
  {1.070f, 2.998f, 0.0f, 1.296f, 2.389f, 0.0f},
  {0.919f, 1.558f, 3.924f, 1.261f, 2.495f, 0.0f},
  {0.918f, 1.557f, 2.240f, 1.256f, 2.439f, 0.0f},
  {0.907f, 1.955f, 3.210f, 1.334f, 3.132f, 0.0f},
  {1.098f, 1.960f, 0.0f, 1.222f, 3.658f, 0.0f},
  {1.082f, 1.913f, 2.942f, 1.436f, 0.0f, 0.0f},
  {0.940f, 1.620f, 2.512f, 1.336f, 3.017f, 0.0f},
  {0.949f, 1.539f, 2.587f, 1.148f, 2.125f, 5.231f},
  {0.945f, 1.954f, 2.468f, 1.275f, 2.635f, 0.0f},
  {0.916f, 1.660f, 2.852f, 1.242f, 2.432f, 0.0f},
  {0.838f, 1.253f, 2.108f, 1.256f, 2.456f, 0.0f}};
```

Thus, as an example, an Ith codebook of the plurality of codebooks may be defined by the plurality of truncations defined by the respective vector no_lead[ ][I] and the respective vector of scale representations scales[ ][I], wherein each truncation k no_lead[k][I] is scaled with a respective scale representation scales [k][I] associated with this truncation. Thus, a first set of codevectors of a plurality of codevectors of an Ith codebook is defined by the first truncation scaled by the respective first scale representation, i.e., under the assumption of I=2 the first scale representation would be 0.887 in the above-mentioned example, a second set of codevectors of the plurality of codevectors Ith codebook is defined by the second truncation scaled by the respective second scale representation, i.e., under the assumption of I=2 the second scale representation would be 1.635 in the above-mentioned example, and so on.

For instance, the number of codebooks of the plurality of codebooks may correspond to the number of codevectors of the first stage, wherein each codevector of the first stage is associated with a respective codebook of the second stage. As an example, the first quantized representation of the input vector may represent a codevector index being indicative of the codevector selected in the first stage. Then, in step 710, a corresponding codebook of the plurality of codebooks is selected based on the codevector index. For instance, each codevector index of first stage may be associated with a corresponding codebook of the second stage.

As a non limiting example, the codevector index may be denoted as I and the corresponding codebook may be defined by the a respective leader vector no_lead[ ][I[ ] and a respective vector of scale representations scales[ ][I].

Then, at a step 820 a second quantized representation of the input vector is determined based on the selected codebook.

It hast to be understood, that this input vector may represent to normalized input vector or the non-normalized input vector.

For instance, said determining a second quantized representation of the input vector may comprise determining a codevector of the plurality of codevectors of the selected codebook which has a minor or minimum distortion compared to the input vector.

As an example, a distortion metric may be used for determining the distortion of a codevector and the input vector. For instance, said distortion metric may be based on any kind of suitable distance between a codevector and the input vector. As an example, a Hamming distance or an Euclidian distance or any other distance may be used. As an example, the codevector for which the distortion metric is to be calculated must not necessarily determined and the distortion metric may be calculated by inherently considering the respective codevector associated with the selected scale representation and the set of basis codevectors associated with this selected scale representation.

For instance, if $c_{x,z,y}=[c_{x,z,y,0}, c_{x,z,1}, \ldots, c_{x,z,n-1}]$ represents the codevector and $i=[i_0, i_1, \ldots, i_{n-1}]$ represents the input vector, a distance d may be calculated based on $$d = \sum_{k=0}^{n-1} (i_k - c_{x,z,y,k})^2. \quad (1)$$

As an example, the respective codevector represents an n-dimensional vector comprising codevector values $c_0 \ldots c_{n-1}$ and the input vector represents an n-dimensional vector comprising input vector values $i_0 \ldots i_{n-1}$, wherein determining the respective distance d is performed based on calculating d'

$$d' = \sum_{k=0}^{n-1} c_k^2 - 2\sum_{k=0}^{n-1} i_k \cdot c_k. \quad (2)$$

This distortion metric (2) may be considered to represent a simplified metric of metric (1) without any loss of quality.

Furthermore, as an example, the distortion metric may be determined based on a weighting function.

For instance, the respective codevector represents an n-dimensional vector comprising codevector values $c_0 \ldots c_{n-1}$ and the input vector represents an n-dimensional vector comprising input vector values $i_0 \ldots i_{n-1}$, wherein determining the respective distance $d_w'$ is performed based on calculating $$d_w' = \sum_{k=0}^{n-1} w_k \cdot c_k^2 - 2\sum_{k=0}^{n-1} w_k \cdot i_k \cdot c_k,$$

wherein $w_k$ represent weighting factors of the weighting function.

Accordingly, in step 820 a codevector of the plurality of codevectors may be determined based on the applied distortion metric, wherein this determining may for instance comprise calculating the distortion for at least one codevector of the plurality of codevectors, wherein the codevector of the at least one codevector is selected for quantization in step 820 which has the lowest distortion in accordance with the determined distortion metric. For instance, said at least one codevector may represent all codevectors of the plurality of codevectors of the selected codebook or a subset of codevectors of the plurality of codevectors of the selected codebook.

Although the above examples describe embodiments of the invention operating within a codec within an apparatus 10, it would be appreciated that the invention as described below may be implemented as part of any audio (or speech) codec, including any variable rate/adaptive rate audio (or speech) codec. Thus, for example, embodiments of the invention may be implemented in an audio codec which may implement audio coding over fixed or wired communication paths.

Thus user equipment may comprise an audio codec such as those described in embodiments of the invention above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Thus at least some embodiments of the encoder may be an apparatus comprising at least one processor and at least one memory including computer program code the at least one memory and the computer program code configured to, with the at least one processor, cause the apparatus at least to perform: determining at least two linear prediction coefficients for an audio frame digitally sampled at a first sampling rate; converting the at least two linear prediction coefficients to at least two line spectral frequency coefficients; and quantising each of the at least two line spectral frequency coefficients to produce at least two quantized line spectral frequency coefficients, wherein a highest order quantized line spectral frequency coefficient of the at least two quantized line spectral frequency coefficients lies within a first frequency range of at least two frequency ranges, wherein the first frequency range is associated with the first sampling rate, and wherein the first frequency range is distinguishable from a second frequency range of the at least two frequency ranges, wherein the second frequency range is associated with a highest order quantized line spectral frequency for an audio frame digitally sampled at a second sampling rate.

In some embodiments of the decoder there may be an apparatus comprising at least one processor and at least one memory including computer program code the at least one memory and the computer program code configured to, with the at least one processor, cause the apparatus at least to perform: receiving, a set of encoded audio parameters for an audio frame, wherein the set comprises indices representing at least two quantized line spectral frequency coefficients, wherein the audio frame when decoded comprises audio samples digitally sampled at a sampling frequency, wherein the sampling frequency is one of a plurality of sampling frequencies for an audio decoder; converting the indices to the at least two quantized line spectral frequency coefficients; and determining the sampling frequency for the audio frame by checking the value of a highest order quantized line spectral frequency coefficient of the at least two quantized line spectral frequency coefficients.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

Thus at least some embodiments of the encoder may be a non-transitory computer-readable storage medium having stored thereon computer readable, which, when executed by a computing apparatus, causes the computing apparatus to perform a method comprising: quantising a vector of a plurality of coefficients using a predictive mode of operation of a vector quantiser, wherein the vector quantiser can operate in either a predictive mode of operation or a non-predictive mode of operation, and wherein the plurality of coefficients are associated with a frame of audio samples; determining a vector of a plurality of recovered coefficients which correspond to the vector of the plurality of coefficients when the vector of the plurality of coefficients is subjected to a frame erasure event; comparing the vector of the plurality of coefficients to the vector of the plurality of recovered coefficients; and determining the mode of operation of the vector quantiser for a vector of a plurality of coefficients associated with a subsequent frame of audio samples, wherein the mode of operation is dependent on the comparison.

The memory may be of any type suitable to the local technical environment and may be implemented using any suitable data storage technology, such as semiconductor-based memory devices, magnetic memory devices and systems, optical memory devices and systems, fixed memory and removable memory, in other words a non-transitory computer-readable storage medium. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:

(a) hardware-only circuit implementations (such as implementations in only analog and/or digital circuitry) and (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method for encoding an audio signal comprising:

quantising a vector of a plurality of coefficients using a predictive mode of operation of a vector quantiser, wherein the vector quantiser can operate in either a predictive mode of operation or a non-predictive mode of operation, and wherein the plurality of coefficients are associated with a current frame of audio samples of the audio signal;

determining a vector of a plurality of recovered coefficients for the current frame of audio samples, wherein the plurality of recovered coefficients correspond to the vector of the plurality of coefficients when the vector of the plurality of coefficients is subjected to a frame erasure event, wherein the vector of the plurality of recovered coefficients is generated by at least part of a frame error concealment process, and wherein the least part of the frame error concealment process is equivalent to at least part of a frame error concealment process at a decoder arranged to de-quantise the vector of the plurality of coefficients;

comparing the vector of the plurality of coefficients to the vector of the plurality of recovered coefficients generated by the at least part of the frame error concealment process; and using a result of the comparison of the vector of the plurality of coefficients to the vector of the plurality of recovered coefficients to determine the mode of operation of the vector quantizer for a frame of audio samples subsequent to the current frame of audio samples.

2. The method as claimed in claim 1, wherein comparing the vector of the plurality of coefficients to the vector of the plurality of recovered coefficients comprises:

determining a distortion measure between the vector of the plurality of coefficients and the vector of the plurality of recovered coefficients; and comparing the determined distortion measure to a predetermined threshold value.

3. The method as claimed in claim 1, wherein the current frame of audio samples is encoded according to a selected one of a plurality of coding modes, and wherein determining the mode of operation of the vector quantiser dependent on the comparison comprises:

determining the mode of operation of the vector quantiser dependent on the comparison and the selected one of the plurality of coding modes.

4. The method as claimed in claim 1, wherein the distortion measure is a Euclidean distance between the vector of the plurality of coefficients and the vector of the plurality of recovered coefficients.

5. The method as claimed in claim 1, wherein the distortion measure is a L1-norm distance between the vector of the plurality of coefficients and the vector of the plurality of recovered coefficients.

6. The method as claimed in claim 1, wherein the vector of the plurality of coefficients is a vector of a plurality of coefficients representative of a plurality of spectral coefficients of the frame of audio samples.

7. The method as claimed in claim 6, wherein vector of the plurality of coefficients representative of the plurality of spectral coefficients of the frame of audio samples is a vector of a plurality of line spectral frequencies.

8. An apparatus for encoding an audio signal comprising at least one processor and at least one memory including computer code for one or more programs, the at least one memory and the computer code configured with the at least one processor to cause the apparatus at least to:

quantise a vector of a plurality of coefficients using a predictive mode of operation of a vector quantiser, wherein the vector quantiser can operate in either a predictive mode of operation or a non-predictive mode of operation, and wherein the plurality of coefficients are associated with a current frame of audio samples of the audio signal;

determine a vector of a plurality of recovered coefficients for the current frame of audio samples, wherein the plurality of recovered coefficients correspond to the vector of the plurality of coefficients when the vector of the plurality of coefficients is subjected to a frame erasure event, wherein the vector of the plurality of recovered coefficients is generated by at least part of a frame error concealment process, and wherein the least part of the frame error concealment process is equivalent to at least part of a frame error concealment process at a decoder arranged to de-quantise the vector of the plurality of coefficients;

compare the vector of the plurality of coefficients to the vector of the plurality of recovered coefficients generated by the at least part of the frame error concealment process; and using a result of the comparison of the vector of the plurality of coefficients to the vector of the plurality of recovered coefficients to determine the mode of operation of the vector quantizer for a frame of audio samples subsequent to the current frame of audio samples.

9. The apparatus as claimed in claim 8, wherein the at least one memory and the computer code configured with the at least one processor configured to cause the apparatus at least to compare the vector of the plurality of coefficients to the vector of the plurality of recovered coefficients is further configured to cause the apparatus at least to:
- determine a distortion measure between the vector of the plurality of coefficients and the vector of the plurality of recovered coefficients; and
- compare the determined distortion measure to a pre-determined threshold value.

10. The apparatus as claimed in claim 8, wherein the current frame of audio samples is encoded according to a selected one of a plurality of coding modes, and wherein the at least one memory and the computer code configured with the at least one processor configured to cause the apparatus at least to determine the mode of operation of the vector quantiser dependent on the comparison is configured to cause the apparatus at least to:
- determine the mode of operation of the vector quantiser dependent on the comparison and the selected one of the plurality of coding modes.

11. The apparatus as claimed in claim 8, wherein the distortion measure is a Euclidean distance between the vector of the plurality of coefficients and the vector of the plurality of recovered coefficients.

12. The apparatus as claimed in claim 8, wherein the distortion measure is a L1-norm distance between the vector of the plurality of coefficients and the vector of the plurality of recovered coefficients.

13. The apparatus as claimed in claim 8, wherein the vector of the plurality of coefficients is a vector of a plurality of coefficients representative of a plurality of spectral coefficients of the frame of audio samples.

14. The apparatus as claimed in claim 13, wherein the vector of the plurality of coefficients representative of the plurality of spectral coefficients of the frame of audio samples is a vector of a plurality of line spectral frequencies.

* * * * *